(12) United States Patent
Yin et al.

(10) Patent No.: US 9,082,717 B2
(45) Date of Patent: Jul. 14, 2015

(54) ISOLATION REGION, SEMICONDUCTOR DEVICE AND METHODS FOR FORMING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 208 days.

(21) Appl. No.: 13/119,129

(22) PCT Filed: Feb. 18, 2011

(86) PCT No.: PCT/CN2011/071093
§ 371 (c)(1),
(2), (4) Date: Mar. 15, 2011

(87) PCT Pub. No.: WO2012/000316
PCT Pub. Date: Jan. 5, 2012

(65) Prior Publication Data
US 2012/0001198 A1 Jan. 5, 2012

(30) Foreign Application Priority Data
Jul. 1, 2010 (CN) .......................... 2010 1 0223894

(51) Int. Cl.
*H01L 29/16* (2006.01)
*H01L 21/336* (2006.01)
(Continued)

(52) U.S. Cl.
CPC ...... *H01L 21/3083* (2013.01); *H01L 21/76232* (2013.01); *H01L 29/66636* (2013.01); *H01L 29/78* (2013.01)

(58) Field of Classification Search
CPC ................... H01L 2224/48091; H01L 21/283; H01L 21/76224

USPC ............. 257/77, 622, 192, E29.02, E29.242, 257/363, E27.016, 288, 66; 438/700, 285, 438/300, 261, 385, 229
See application file for complete search history.

(56) References Cited

U.S. PATENT DOCUMENTS

| 2010/0203692 | A1* | 8/2010 | Kim et al. | 438/229 |
| 2011/0278646 | A1* | 11/2011 | Ng et al. | 257/192 |
| 2011/0303982 | A1* | 12/2011 | Chung et al. | 257/363 |

FOREIGN PATENT DOCUMENTS

| CN | 1953141 | 4/2007 |
| CN | 101540315 | 9/2009 |
| JP | 2008192821 A | 8/2008 |

OTHER PUBLICATIONS

Internation Search Report to PCT/CN2011/071093.
Office Action to Great Britain Equivalent GB 1122114.0 dated Jan. 31, 2014.
(Continued)

*Primary Examiner* — Cathy N Lam
(74) *Attorney, Agent, or Firm* — Troutman Sanders LLP

(57) ABSTRACT

An isolation region is provided. The isolation region includes a first groove and an insulation layer filling the first groove. The first groove is embedded into a semiconductor substrate and includes a first sidewall, a bottom surface and a second sidewall that extends from the bottom surface and joins to the first sidewall. An angle between the first sidewall and a normal line of the semiconductor substrate is larger than a standard value. A method for forming an isolation region is further provided. The method includes: forming a first trench on a semiconductor substrate, wherein an angle between a sidewall of the first trench and a normal line of the semiconductor substrate is larger than a standard value; forming a mask on the sidewall to form a second trench on the semiconductor substrate by using the mask; and forming an insulation layer to fill the first and second trenches. A semiconductor device and a method for forming the same are still further provided. In the semiconductor device, a material of the semiconductor substrate is interposed between a second groove bearing a semiconductor layer for forming an S/D region and the first and second sidewalls. The present invention is beneficial to reduce leakage current.

3 Claims, 6 Drawing Sheets

(51) Int. Cl.
*H01L 21/31* (2006.01)
*H01L 21/308* (2006.01)
*H01L 21/762* (2006.01)
*H01L 29/66* (2006.01)
*H01L 29/78* (2006.01)

(56) References Cited

OTHER PUBLICATIONS

Examination Report from Great Britain Intellectual Property Office dated Aug. 13, 2014.

* cited by examiner

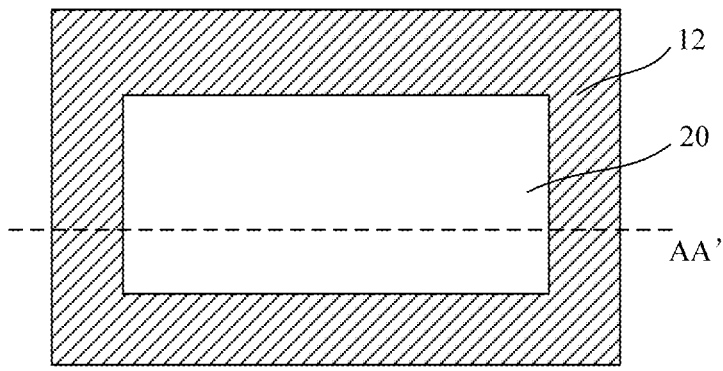
Fig1 -PRIOR ART-
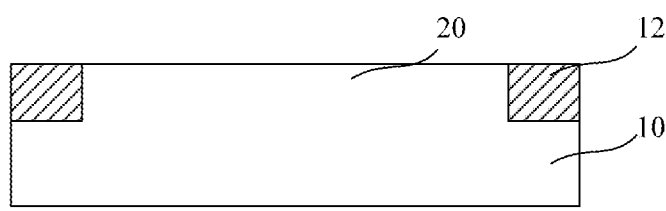
Fig2 -PRIOR ART-
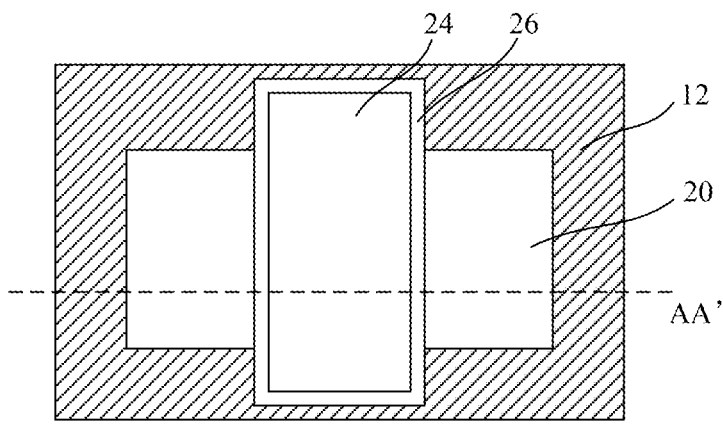
Fig3 -PRIOR ART-
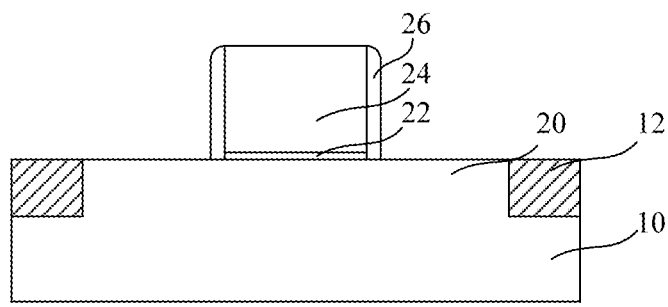
Fig4 -PRIOR ART-

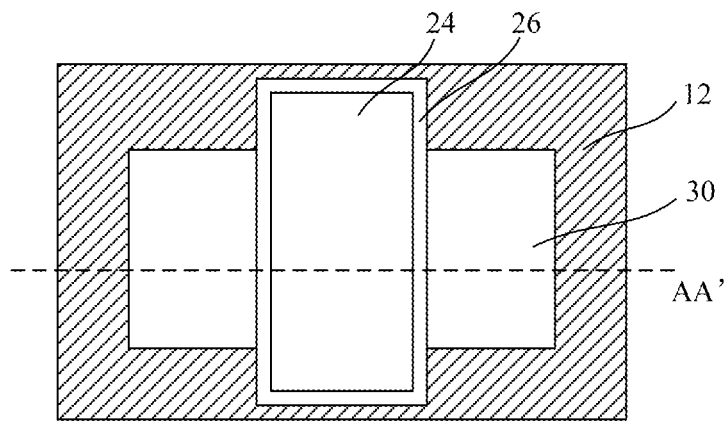
Fig5 -PRIOR ART-
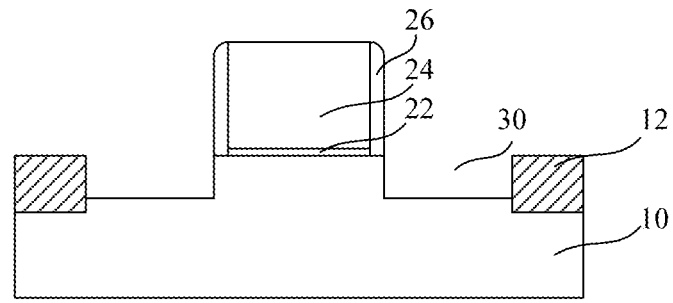
Fig6 -PRIOR ART-
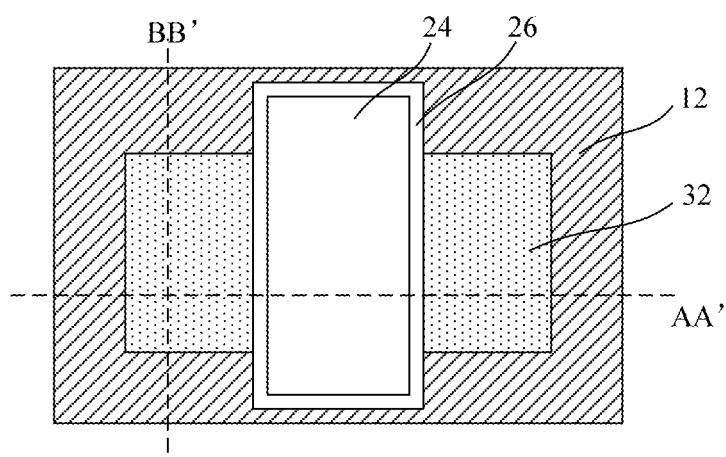
Fig7 -PRIOR ART-

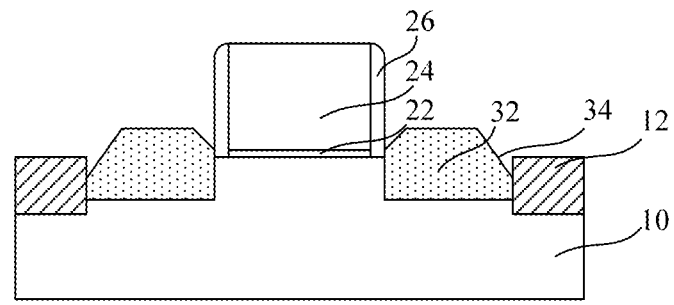
Fig8 -PRIOR ART-
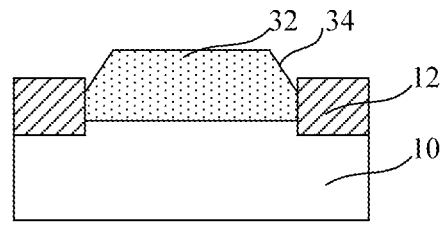
Fig9 -PRIOR ART-
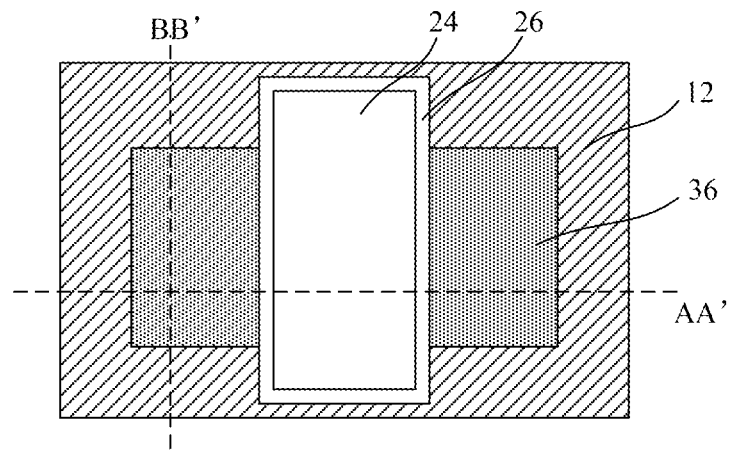
Fig10 -PRIOR ART-
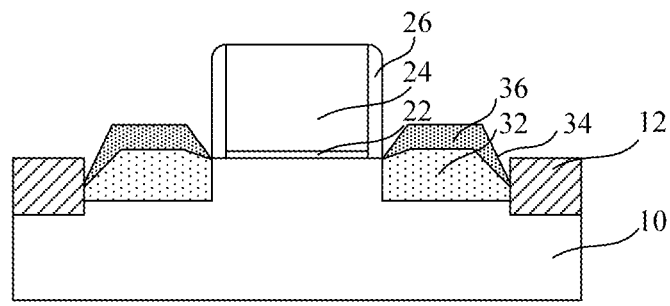
Fig11 -PRIOR ART-

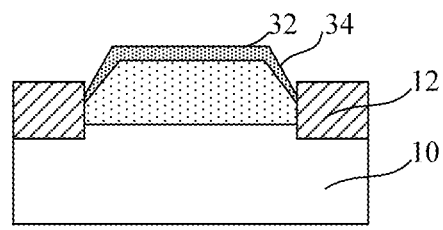
Fig 12 -PRIOR ART-
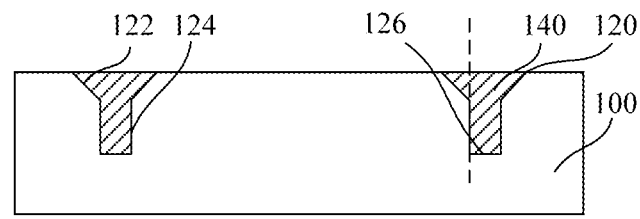
Fig 13
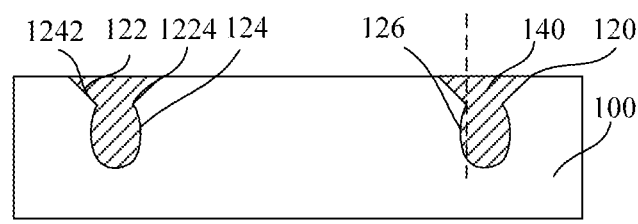
Fig 14
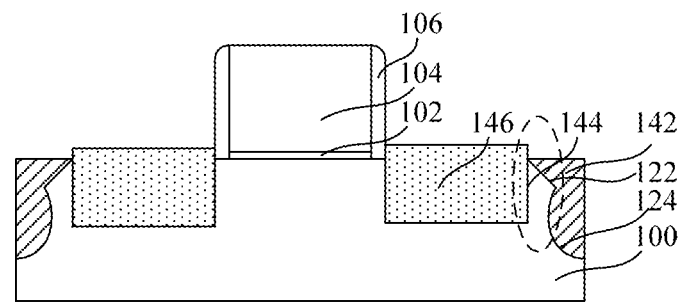
Fig 15

ISOLATION REGION, SEMICONDUCTOR DEVICE AND METHODS FOR FORMING THE SAME

BENEFIT CLAIMS

This application is a US National Stage of International Application No. PCT/CN2011/071093, filed Feb. 18, 2011, which claims the benefit of CN 201010223894.2, filed Jul. 1, 2010.

FIELD OF THE INVENTION

The present invention relates to a technical field of semiconductors, and particularly, to an isolation region, a semiconductor device and methods for forming the same.

BACKGROUND OF THE INVENTION

Currently, a method for forming a semiconductor device comprises the following steps. Firstly, as illustrated in FIGS. 1 and 2, an active region 20 and an isolation region 12 surrounding the active region 20 are formed on a semiconductor substrate 10. Next, as illustrated in FIGS. 3 and 4, a gate stack structure is formed on the active region 20 and extends to the isolation region 12 (the gate stack structure comprises a gate dielectric layer 22, a gate 24 formed on the gate dielectric layer 22, and sidewalls 26 surrounding the gate dielectric layer 22 and the gate 24. In practice, a cap layer is further formed on the gate for preventing the gate from being damaged during the operation. The cap layer is usually made of silicon nitride. The cap layer is not indicated in the text and drawings of this specification for the convenience of description). Next, as illustrated in FIGS. 5 and 6, the gate stack structure and the isolation region 12 are used as a mask, and the semiconductor substrate 10 of a partial thickness in the active region 20 is removed to form a groove 30. Finally, a semiconductor material is produced in the groove 30 for filling into the groove 30 so as to form a source/drain (S/D) region.

However, as illustrated in FIGS. 7 to 9, it is found in practice that a slot 34 is defined at an interface between the S/D region 32 and the isolation region 12. Consequently, as illustrated in FIGS. 10 to 12, when a contact region 36 (e.g., metal silicide layer) is formed subsequently on the S/D region 32, the contact region 36 may likely reach a junction region via the slot 34, thereby causing a leakage current.

SUMMARY OF THE INVENTION

In order to solve the above problem, the present invention provides an isolation region, a semiconductor device and methods for forming the same, which are beneficial to reduce the leakage current.

The present invention provides an isolation region, comprising: a first groove and an insulation layer filling the first groove, wherein the first groove is embedded into a semiconductor substrate and comprises a first sidewall, a bottom surface and a second sidewall that extends from the bottom surface and joins to the first sidewall, and an angle between the first sidewall and a normal line of the semiconductor substrate is larger than a standard value.

Optionally, the angle between the first sidewall and the normal line of the semiconductor substrate is in the range from about 5° to about 20° (5°~20°.

Optionally, in any cross-sectional plane perpendicular to the semiconductor substrate, the second sidewall is joined to the first sidewall at a first joint and a second joint, and an angle between the second sidewall and the normal line of the semiconductor substrate increases from the first joint to the second joint.

A semiconductor device comprising the above isolation region, the semiconductor device further comprises an S/D region, and the S/D region comprises a second groove and a semiconductor layer filling the second groove, wherein there is material of the semiconductor substrate interposed between the second groove and the first and second sidewalls.

Optionally, when the material of the semiconductor substrate is Si, for a PMOS device, the semiconductor layer is $Si_{1-x}Ge_x$, and for an NMOS device, the semiconductor layer is Si:C.

A method for forming an isolation region, comprising: forming a first trench on a semiconductor substrate, wherein an angle between a sidewall of the first trench and a normal line of the semiconductor substrate is larger than a standard value; forming a mask on the sidewall to form a second trench on the semiconductor substrate by using the mask; and forming an insulation layer to fill the first and second trenches.

Optionally, the angle between the sidewall and the normal line of the semiconductor substrate is about 5°~about 20°.

Optionally, before the insulation layer is formed, the method further comprises performing an etching operation on the second trench to expand the second trench.

A method for forming a semiconductor device, comprising: forming the isolation region using the above method, so as to isolate active regions; forming on the semiconductor substrate a gate stack structure that resides on the active region and extends to the isolation region; using the gate stack structure and the isolation region as a mask to form a third trench in the active region, wherein there is material of the semiconductor substrate interposed between the third trench and the isolation region; and filling a semiconductor layer into the third trench to form an S/D region.

Optionally, when the material of the semiconductor substrate is Si, for a PMOS device, the semiconductor layer is $Si_{1-x}Ge_x$, and for an NMOS device, the semiconductor layer is Si:C.

As compared with the prior art, the technical solution of the present invention has the following advantages:

On the premise that opening areas of the isolation region are the same, the cross-sectional area of the embedded isolation region is made to be smaller than the opening area by increasing the angle between the first sidewall (i.e., the sidewall of the first trench) and the nominal line of the semiconductor substrate. In the subsequent steps, the S/D region is formed by using the opening of the isolation region as the mask. In addition, when the groove bearing the material of the S/D region is formed, an anisotropic etching process is adopted, so that the active region connected to the isolation region is removed at the opening of the isolation region. In any cross-sectional plane parallel to the top surface of the semiconductor substrate, the active region joined to the isolation region will no longer be removed since the cross-section area of the isolation region is reduced, i.e., the embedded isolation region is still joined to the material of the active region (i.e., the material of the semiconductor substrate). In other words, the material of the semiconductor substrate is retained between the groove and the isolation region. That is to say, each wall of the groove is made of the material of the semiconductor substrate (wherein, the sidewall of the groove close to the isolation region is made of the material of the semiconductor substrate, instead of the material of the isolation region, due to the material of the semiconductor substrate remaining between the groove and the isolation region). Then the material of the semiconductor substrate is used as seed crystal to grow the material of the S/D region in the groove (when the material of the semiconductor substrate is Si, for a PMOS device, the semiconductor layer is $Si_{1-X}Ge_X$, and for an NMOS device, the semiconductor layer is Si:C). This is beneficial to reduce the possibility of defining a slot at an interface between the formed S/D region and the isolation region. Furthermore, due to the reduction of the possibility of defining the slot, a stress loss will also be reduced when the material of the S/D region is formed in the groove.

In any cross-sectional plane perpendicular to the semiconductor substrate, from the first joint to the second joint, the angle between the second sidewall and the normal line of the semiconductor substrate increases. This is beneficial to expand the cross-sectional area of a region defined by the second sidewall. Then, the above region is filled with the insulation layer to form the isolation region, and this is beneficial to enhance the isolation effect; or before the insulation layer is formed, an etching operation is performed on the second groove to expand the second groove, which may increase the cross-section area of the second groove. Then, the second groove is filled with the insulation layer, and this is beneficial to enhance the isolation effect.

BRIEF DESCRIPTION OF THE DRAWINGS

The following sectional views are all obtained by cutting the formed structures along lines AA' and BB' shown in corresponding top views.

FIGS. 1~2 illustrate structural diagrams after an active region is formed according to the prior art.

FIGS. 3~4 illustrate structural diagrams after a gate stack structure is formed according to the prior art.

FIGS. 5~6 illustrate structural diagrams after a groove is formed according to the prior art.

FIGS. 7~9 illustrate structural diagrams after an S/D region is formed according to the prior art.

FIGS. 10~12 illustrate structural diagrams after a contact region is formed according to the prior art.

FIG. 13 illustrates a structural diagram of a first embodiment of an isolation region according to the present invention.

FIG. 14 illustrates a structural diagram of a second embodiment of an isolation region according to the present invention.

FIG. 15 illustrates a structural diagram of an embodiment of a semiconductor device according to the present invention.

DETAILED DESCRIPTION OF THE EMBODIMENTS

Figure 16:
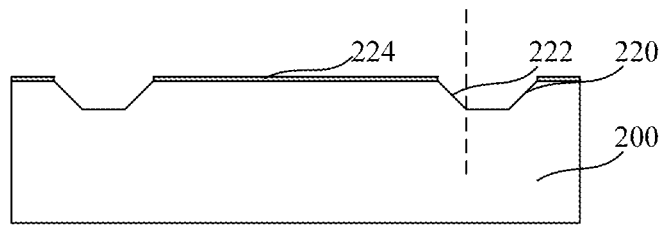
FIG. 16 illustrates a structural diagram after a first trench is formed in a first embodiment of a method for forming an isolation region according to the present invention.

The following text provides many different embodiments or examples to implement the technical solution of the present invention. Although descriptions of the components and arrangements of specific examples are given as follows, they are just exemplary, and do not intend to limit the present invention.

In addition, reference numbers and/or letters can be repeatedly used in different embodiments of the present invention for the purposes of simplification and clearness, without indicating the relationships between the discussed embodiments and/or arrangements.

The present invention provides examples of various specific processes and/or materials. But it is apparent that substitutive applications of other processes and/or materials conceivable by a person skilled in the art do not deviate from the scope of the present invention. To be emphasized, the interfaces of various regions described in this specification include necessary extensions made according to the requirements of the processes or procedures.

As illustrated in FIG. 13, the present invention provides an isolation region comprising a first groove 120 and an insulation layer 140 filling the first groove 120. The first groove 120 is embedded into a semiconductor substrate 100 and comprises a first sidewall 122, a bottom surface 126 and a second sidewall 124 that extends from the bottom surface 126 and joins to the first sidewall 122. In which, an angle between the first sidewall 122 and a normal line of the semiconductor substrate 100 (as indicated by a dashed line in the drawing) is larger than a standard value.

Herein the standard value means that when the groove 120 is to be etched in practice, if an angle between the sidewall of the groove 120 and the normal line of the semiconductor substrate 100 is designed to be $\alpha$, while an angle actually obtained to meet the design requirement is $\alpha + \alpha$ due to the demand of the process or procedure (e.g., there exists a process error or the subsequent filling effect needs to be improved), then $\alpha$ is a standard value.

In the present embodiment, the semiconductor substrate 100 is a substrate of silicon, and in other embodiments, the semiconductor substrate 100 may also be made of other compound semiconductor, such as silicon carbide (SiC), gallium arsenide (GaAs), indium arsenide (InAs) or indium phosphide (InP). In addition, the semiconductor substrate 100 preferably includes an epitaxial layer. The semiconductor substrate 100 may also include a silicon on insulator (SOI) structure. The insulation layer 140 may be made of silicon nitride, silicon oxynitride or non-doped silicon oxide.

In the present embodiment, the angle between the first sidewall 122 and the normal line of the semiconductor substrate 100 may be about 5°~about 20°, such as 8°, 10° or 15°. On the premise that the opening areas of the isolation region are the same, the cross-sectional area of the embedded isolation region is made to be smaller than the opening area. Then, in the following step, the material of the semiconductor substrate 100 may be residual between the groove bearing the material of an S/D region and the isolation region, i.e., each wall of the groove is made of the material of the semiconductor substrate 100. This is beneficial to reduce the possibility of defining a slot at an interface between the formed S/D region and the isolation region.

Particularly, in a second embodiment of the isolation region, the present invention further provides an isolation region. In which, in any cross-sectional plane perpendicular to the semiconductor substrate 100 (for example, the cross-section as illustrated in FIG. 14), the second sidewall 124 is joined to the first sidewall 122 at a first joint 1224 and a second joint 1242. From the first joint 1224 to the second joint 1242, an angle between the second sidewall 124 and the normal line of the semiconductor substrate 100 increases. This is beneficial to expand a cross-sectional area of a region defined by the second sidewall 124. Then, the above region is filled with the insulation layer 140 to form the isolation region, and this is beneficial to enhance the isolation effect. To be noted, in any cross-sectional plane perpendicular to the semiconductor substrate 100, the second sidewall 124 may have an arc shape, a fold line shape (not shown), etc.

As illustrated in FIG. 15, the present invention provides a semiconductor device comprising the above isolation region (taking the second embodiment for example). The semiconductor device further comprises a gate stack structure (the gate stack structure comprises a gate dielectric layer 102, a gate 104 formed on the gate dielectric layer 102, and sidewalls 106 surrounding the gate dielectric layer 102 and the gate 104, which are beneficial to reduce a parasitic capacitance; and in other embodiments, the sidewalls 106 may be located on the gate dielectric layer 102 and surround the gate 104) and an S/D region (taking an embedded source/drain region for example). In which, the S/D region comprises a second groove 144 and a semiconductor layer 146 filling the second groove 144. The material of the semiconductor substrate 100 is interposed between the second groove 144 and the first and second sidewalls 122, 124 (indicated by a dashed frame in the drawing). That is to say, when the second groove 144 bearing the material of the S/D region is formed, each wall of the second groove 144 is made of the material of the semiconductor substrate 100, and then the material of the semiconductor substrate 100 is used as seed crystal. This is beneficial for a uniform growth of the semiconductor layer 146 for forming the S/D region along each direction in the second groove 144, so as to reduce the possibility of defining a slot at an interface between the formed S/D region and the isolation region 142.

When the semiconductor substrate 100 is Si, for the PMOS device, the semiconductor layer may be $Si_{1-X}Ge_X$ (the value range of X may be about 0.1~about 0.7, which can be flexibly adjusted according to a process requirement, such as 0.2, 0.3, 0.4, 0.5 or 0.6, and the value of X in this specification is the same as that indicated herein unless otherwise specified); for the NMOS device, the semiconductor layer may be Si:C (the atomic percentage of C may be about 0.2%~about 2%, such as 0.5%, 1% or 1.5%, the content of C may be flexibly adjusted according to a process requirement, and the atomic percentage of C in this specification is the same as that indicated herein unless otherwise specified). To be noted, the semiconductor layer may be made of a semiconductor material doped with ions, e.g., $Si_{1-X}Ge_X$ or Si:C of N type or P type. The ion doping operation may be performed directly during the production of the semiconductor material (e.g., adding a reactant containing the doped ion components into reactants for producing the semiconductor material), or performed through an ion implantation process after the semiconductor material is produced. Any conventional ion implantation process may be adopted to perform the ion doping operation, which herein is not described in detail.

Forming the S/D region with the above material is beneficial to adjust the stress in the channel region of the semiconductor device by using the stress provided by the S/D region, so as to improve the mobility of carriers in the channel region. Forming the S/D region using the method provided by the present invention is beneficial to reduce the stress loss of the S/D region.

The invention further provides a method for forming an isolation region, comprising:

Firstly, as illustrated in FIG. 16, a first trench 220 is formed on a semiconductor substrate 200. An angle between a sidewall 222 of the first trench 220 and a normal line of the semiconductor substrate 200 (as indicated by a dashed line in the drawing) is larger than a standard value.

The semiconductor substrate 200 is a substrate of silicon, and in other embodiments, the semiconductor substrate 200 may also be made of other compound semiconductor such as silicon carbide (SiC), gallium arsenide (GaAs), indium arsenide (InAs) or indium phosphide (InP). In addition, the semiconductor substrate 200 preferably includes an epitaxial layer. The semiconductor substrate 200 may also include a silicon on insulator (SOI) structure.

The step of forming the first trench 220 comprises: forming silicon oxide (using a thermal oxidation process or a deposition process) and silicon nitride in sequence on the semiconductor substrate 200 (using a deposition process); next, forming a patterned photoresist layer on the silicon nitride; next, using the patterned photoresist layer as a mask to pattern the silicon nitride and the silicon oxide, so as to form a hard mask 224 (i.e., in order to make the structure clear, the illustrated hard mask 224 contains the silicon oxide and the silicon nitride formed thereon); next, removing the patterned photoresist layer; and finally, etching the semiconductor substrate 200 of a partial thickness by using the hard mask 224.

In the prior art, the reasons why a slot is defined between the S/D region and the isolation region are as follows. The S/D region is formed by filling a semiconductor material into a trench, and the semiconductor material is produced through an epitaxial process. The gate stack structure and the isolation region are used as the mask when the trench is formed. That is, the sidewalls of the isolation region will be exposed after the trench is formed. In other words, walls of the trench include both the material of the semiconductor substrate and the sidewall of the isolation region. When the semiconductor material is produced through the epitaxial process, the material of the semiconductor substrate is used as the seed crystal, i.e., the sidewall of the isolation region used as the wall of the trench cannot provide the seed crystal. In addition, it is found that the semiconductor material has different growth rates along different crystal orientations. Specifically, as compared with orientations (100) and (110), the semiconductor material has a slower growth rate along the orientation (111). In practice, an orientation perpendicular to the semiconductor substrate 100 generally is the orientation (100), and an orientation parallel to the semiconductor substrate 100 is the orientation (110). Then the orientation (111) obliquely crosses the orientations (100) and (110). That is, since the semiconductor material has a slower growth rate along the orientation (111), the semiconductor material will form an oblique side surface (along the orientation (111)), and a slot will be defined between the oblique side surface and the sidewalls of the isolation region 120.

It is considered that it is beneficial to reduce or even eliminate the slot between the S/D region and the isolation region so as to reduce the leakage current when the material of the semiconductor substrate is retained or formed on the sidewalls of the isolation region. In other words, the proportion of the material of the semiconductor substrate in the walls of the trench is increased. That is, by supplying the material of the semiconductor substrate having different crystal orientations as the seed crystal, the above slot is filled by the semiconductor material formed by the epitaxial growth of the supplied seed crystal.

In the present embodiment, the first trench 220 may be formed through an etching process. The angle between the sidewall 222 and the normal line of the semiconductor substrate 200 may be about 5°~about 20°, such as 8°, 10° or 15°.

Figure 17:
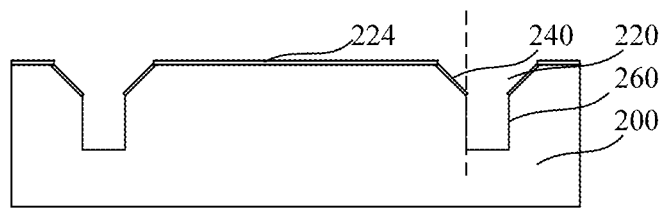
FIG. 17 illustrates a structural diagram after a second trench is formed in the first embodiment of a method for forming an isolation region according to the present invention.

Subsequently, as illustrated in FIG. 17, a mask 240 is formed on the sidewall 222, and a second trench 260 is formed on the semiconductor substrate 200 by using the mask 240.

The mask 240 may be any semiconductor material rather than the material of the semiconductor substrate 200, such as silicon nitride, silicon oxynitride or non-doped silicon oxide. The material of the mask 240 may be the same as the material of the insulation layer for filling the trench subsequently so as to form the isolation region, e.g., when the material of the insulation layer for filling the trench subsequently so as to form the isolation region is the non-doped silicon oxide, the material of the mask may also be the non-doped silicon oxide. This is beneficial for compatibility of the technical solution of the present invention with the conventional process. The mask 240 may be formed by using a selective deposition process. The second trench 260 may be formed by using an etching process.

Figure 18:
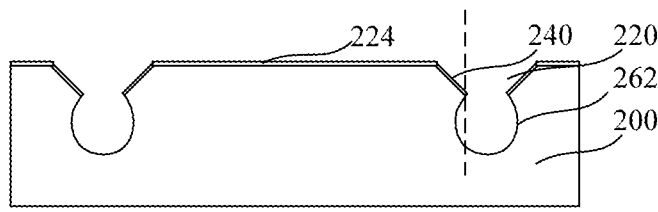
FIG. 18 illustrates a structural diagram after a second trench is formed in a second embodiment of a method for forming an isolation region according to the present invention.

Other embodiments may further comprise: performing an etching operation on the second trench 260 to expand the second trench 260. An isotropic or anisotropic etching process may be adopted to perform the operation for expansion of the second trench 260. Taking the operation for expansion being performed by using the isotropic etching process for example, as illustrated in FIG. 18, herein in any cross-sectional plane (e.g., the cross-section as illustrated in the drawing) perpendicular to the top surface of the semiconductor substrate 200, the sidewall 262 of the second trench 260 may have an arc shape. When the operation for expansion is performed by using the anisotropic etching process, the sidewall of the second trench 260 may have a fold line shape (not shown).

The cross-sectional area of the second trench 260 may be increased by performing an etching operation on the second trench 260 to expand the second trench 260. Consequently, the second trench 260 is filled by the insulation layer and this is beneficial to enhance the insulation effect.

Figure 19:
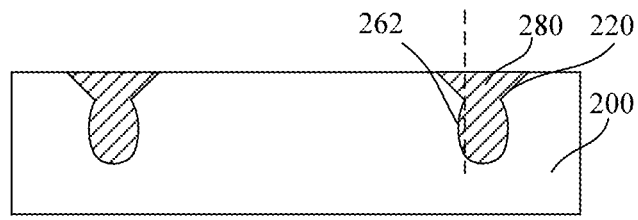
FIG. 19 illustrates a structural diagram after an insulation layer is formed in the first embodiment of a method for forming an isolation region according to the present invention.

Next, as illustrated in FIG. 19, an insulation layer 280 is formed to fill the first trench 220 and the second trench 260.

The insulation layer 280 may be silicon nitride, silicon oxynitride or non-doped silicon oxide. Before the insulation layer 280 is formed, the mask 240 may be removed or not removed (in this embodiment, an example is taken to remove the mask, or wherein the material of the mask is the same as that of the insulation layer). The hard mask 224 will also be removed before subsequent steps.

Figure 20:
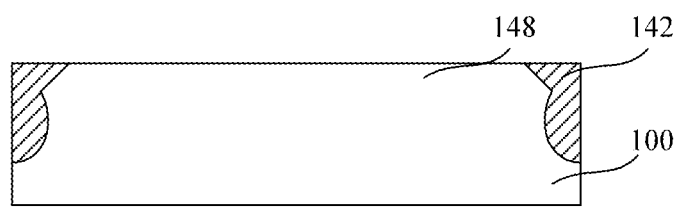
FIG. 20 illustrates a structural diagram after an isolation region is formed in an embodiment of a method for forming a semiconductor device according to the present invention.
Figure 21:
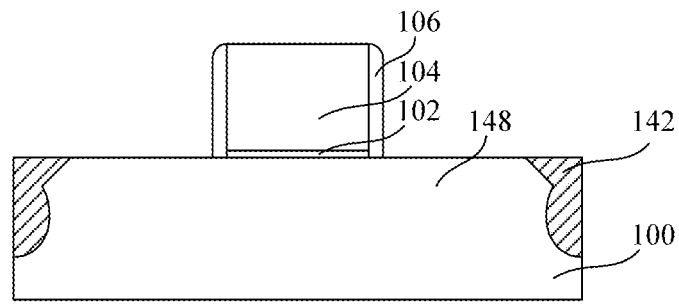
FIG. 21 illustrates a structural diagram after a gate stack structure is formed in an embodiment of a method for forming a semiconductor device according to the present invention.
Figure 22:
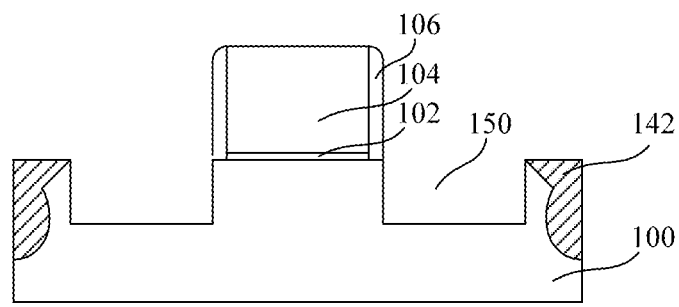
FIG. 22 illustrates a structural diagram after a third trench is formed in an embodiment of a method for forming a semiconductor device according to the present invention.
Figure 23:
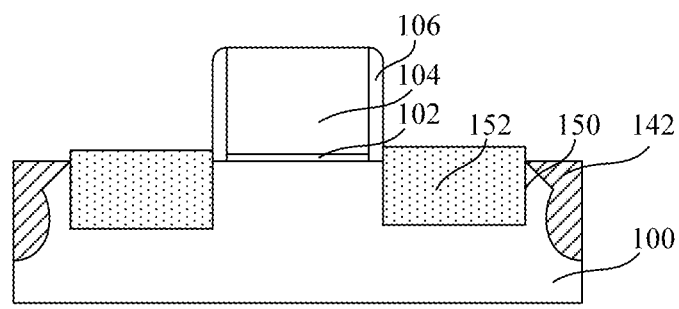
FIG. 23 illustrates a structural diagram after a semiconductor layer is formed in an embodiment of a method for forming a semiconductor device according to the present invention.

The present invention further provides a method for forming a semiconductor device, and the method comprises the following steps. Firstly, as illustrated in FIG. 20, an isolation region 142 is formed using the above method (e.g., see the second embodiment of the isolation region) to isolate active regions 148. Next, as illustrated in FIG. 21, a gate stack structure (the same as that described in the embodiment of the aforementioned semiconductor device, and herein is not repeated) is formed on the semiconductor substrate 100. The gate stack structure passes through the active region 148 and extends to the isolation region 142. Next, as illustrated in FIG. 22, the gate stack structure and the isolation region are used as the mask to form a third trench 150 in the active region. Finally, as illustrated in FIG. 23, a semiconductor layer 152 is filled into the third trench 150 to form an S/D region. The third trench 150 may be formed by using an anisotropic etching process. The material of the semiconductor layer 152 is the same as that described in the embodiment of the aforementioned semiconductor device, and herein is not repeated.

On the premise that the opening areas of the isolation region are the same, the cross-sectional area of the embedded isolation region is made to be smaller than the opening area by increasing the angle between the sidewall of the first trench and the nominal line of the semiconductor substrate. In the subsequent steps, the S/D region is formed by using the opening of the isolation region as the mask. In addition, when the third trench bearing the material of the S/D region is formed, the anisotropic etching process is adopted, so that the active region connected to the isolation region is removed at the opening of the isolation region. On any cross-section parallel to the semiconductor substrate, the active region joined to the isolation region will no longer be removed since the cross-section area of the isolation region is reduced, i.e., the embedded isolation region is still joined to the material of the active region (i.e., the material of the semiconductor substrate). In other words, the material of the semiconductor substrate is residual between the third trench and the isolation region. That is to say, each wall of the third trench is made of the material of the semiconductor substrate. Then the material of the semiconductor substrate is used as seed crystal. This is beneficial for a uniform growth of the semiconductor material for forming the S/D region along each direction in the trench, and thus beneficial to reduce the possibility of defining a slot at an interface between the formed S/D region and the isolation region.

Furthermore, the scope of the present invention is not limited to the processes, structures, manufacturing, compositions, means, methods and steps of the specific embodiments as described in the specification. According to the disclosure of present invention, a person skilled in the art will easily appreciate that, when the processes, structures, manufacturing, compositions, means, methods and steps currently existing or to be developed in future are adopted to perform functions substantially the same as corresponding embodiments described in the present invention, or achieve substantially the same effects, a person skilled in the art can make applications of them under the teaching of the present invention, without deviating from the scope of the present invention.

What is claimed is:

1. A semiconductor structure, comprising:
a first groove and an insulation layer filling the first groove, wherein the first groove is embedded into a semiconductor substrate and includes a top portion and a bottom portion, wherein the top portion is surrounded by a first sidewall, wherein the bottom portion is surrounded by a second sidewall and includes a bottom surface, wherein the first sidewall, the second sidewall, and the bottom surface are arranged along a thicknesses direction of the semiconductor substrate; and wherein in any cross-sectional plane perpendicular to the semiconductor substrate, the second sidewall has a cross-section view with an arc profile or a fold-line profile, wherein an angle between the first sidewall and a normal line of the semiconductor substrate is larger than an angle between the second sidewall and the normal line of the semiconductor substrate; and a source/drain (S/D) region, wherein the S/D region comprises a second groove and a semiconductor layer filling the second groove, wherein the material of the semiconductor substrate is interposed between the first groove and the second groove in both a length direction and a width direction of a gate.

2. The semiconductor structure according to claim 1, wherein the angle between the first sidewall and the normal line of the semiconductor substrate is in a range from about 5° to about 20°.

3. The semiconductor according to claim 1, wherein when a material of the semiconductor substrate is Si, for a PMOS device, the semiconductor layer is $Si_{1-x}Ge_x$; and for an NMOS device, the semiconductor layer is Si:C.

* * * * *